(12) United States Patent
Varnica et al.

(10) Patent No.: US 8,751,912 B1
(45) Date of Patent: Jun. 10, 2014

(54) LAYERED LOW DENSITY PARITY CHECK DECODER

(75) Inventors: Nedeljko Varnica, Sunnyvale, CA (US); Panu Chaichanavong, Sunnyvale, CA (US); Heng Tang, San Jose, CA (US)

(73) Assignee: Marvell International Ltd. (BM)

( * ) Notice: Subject to any disclaimer, the term of this patent is extended or adjusted under 35 U.S.C. 154(b) by 507 days.

(21) Appl. No.: 12/987,419

(22) Filed: Jan. 10, 2011

Related U.S. Application Data

(60) Provisional application No. 61/294,421, filed on Jan. 12, 2010.

(51) Int. Cl.
*H03M 13/00* (2006.01)
*G06F 11/00* (2006.01)

(52) U.S. Cl.
USPC .......................................... 714/785; 714/801

(58) Field of Classification Search
None
See application file for complete search history.

(56) References Cited

U.S. PATENT DOCUMENTS

| | | | | |
|---|---|---|---|---|
| 5,936,978 A * | 8/1999 | Ramesh et al. | | 714/762 |
| 6,973,613 B2 * | 12/2005 | Cypher | | 714/773 |
| 7,325,183 B2 * | 1/2008 | Deolalikar | | 714/777 |
| 7,827,461 B1 * | 11/2010 | Low et al. | | 714/752 |
| 7,853,855 B1 * | 12/2010 | He | | 714/755 |
| 8,196,010 B1 * | 6/2012 | Gunnam et al. | | 714/758 |
| 8,291,283 B1 * | 10/2012 | Rad et al. | | 714/752 |
| 8,291,285 B1 * | 10/2012 | Varnica et al. | | 714/752 |
| 8,473,806 B1 * | 6/2013 | Rad et al. | | 714/752 |
| 8,595,548 B1 * | 11/2013 | Gunnam et al. | | 714/6.24 |
| 2006/0015802 A1 * | 1/2006 | Hocevar | | 714/805 |
| 2008/0301521 A1 * | 12/2008 | Gunnam et al. | | 714/757 |
| 2009/0070659 A1 * | 3/2009 | Zhong et al. | | 714/801 |
| 2010/0037121 A1 * | 2/2010 | Jin et al. | | 714/763 |
| 2010/0042891 A1 * | 2/2010 | Gunnam et al. | | 714/752 |
| 2010/0241933 A1 * | 9/2010 | Latremouille | | 714/785 |
| 2011/0029839 A1 * | 2/2011 | Zhong et al. | | 714/763 |
| 2011/0252294 A1 * | 10/2011 | Ng et al. | | 714/804 |

* cited by examiner

*Primary Examiner* — Daniel McMahon

(57) ABSTRACT

Apparatuses and methods associated with instant syndrome computation in a layered LDPC decoder are described. According to one embodiment, an apparatus includes a plurality of hardware layers, where a hardware layer is configured to compute a syndrome value from one or more bit values in the codeword. The apparatus includes a plurality of physical memories configured to store a plurality of syndrome values, where a physical memory is configured to store syndrome values computed by one or more hardware layers. The apparatus includes circuitry configured to simultaneously store a syndrome value computed by a hardware layer in physical memories associated with a bit in the codeword. The apparatus includes a decode logic configured to signal successful decoding of the codeword based, at least in part, on determining that a set of syndromes are satisfied based on values stored in the plurality of physical memories.

20 Claims, 5 Drawing Sheets

LAYERED LOW DENSITY PARITY CHECK DECODER

CROSS REFERENCE TO RELATED APPLICATIONS

This application claims the benefit of U.S. provisional application Ser. No. 61/294,421 filed on Jan. 12, 2010, which is hereby wholly incorporated by reference.

BACKGROUND

A basic problem in communications and data storage involves determining whether information received at a receiver accurately reflects information transmitted from a transmitter. Conventionally, additional verification bits (e.g., parity bits, cyclic redundancy check bits) have been added to message bits to facilitate improving confidence that a received message matches a transmitted message. The communication/data storage system, therefore typically includes an Error-Correcting Code (ECC). For example, in the encoding process, the codeword of an ECC code is constructed by adding redundancy/check bits to the data field. Low density parity check (LDPC) codes define one type of ECC.

LDPC codes are linear block codes associated with a sparse parity check matrix that can be represented as a bipartite graph. The sparsity refers to a condition where a parity check matrix for an LDPC code may be constrained to have less than a certain number of ones per column and to have less than a certain number of ones per row.

An LDPC decoder receives a vector (received vector), attempts to decode the most likely codeword corresponding to the received vector, and reports on whether the decoder vector is a valid codeword. An LDPC codeword may include message bits and redundancy bits. The redundancy bits may be, for example, parity bits. An LDPC code may be a linear (N,K) block code with K information bits mapped to a codeword of block length N. An LDPC code C can be specified in terms of a low-density (e.g., sparse) N×K binary parity check matrix. While examples are provided in terms of binary codes herein, it should be understood that similar methodologies can be applied to non-binary codes, where the word "bit" is replaced by the word "non-binary symbol".

A codeword can be decoded and verified in pieces where beliefs are built up about certain pieces of the codeword and then those beliefs are used to decode other pieces of the codeword. Decoding will continue until the constraints for a codeword have been satisfied, until a maximum number of tries (e.g., iterations through an LDPC decoder) have been attempted, or until other criteria terminate decoding.

One type of LDPC decoder is a layered decoder. FIG. 1 illustrates one example of a conventional layered decoder 10. The layered decoder 10 provides a convergence flag when the convergence verification unit 12 determines that the layered decoder 10 has converged on a decision concerning decoding a codeword. The convergence verification unit 12 will accept a syndrome input from a syndrome computation unit 20 and will also accept a hard decision ("HD") change input from an HD tracking unit 22. The syndrome and HD change signals can be combined to determine whether the layered LDPC decoder 10 has reached convergence. The syndrome computation unit 20 computes the syndromes of a current layer in the layered decoder 10 based on whether all check nodes in the layer are satisfied. The HD tracking unit 22 can verify whether the updated HD has changed its value compared to the previous update of the same bit (variable) node. The update will have been performed in a layer that was processed earlier.

The syndrome computation unit 20 and the HD tracking unit 22 receive an updated HD from a logic 30 that is responsible for processing and/or updating bit nodes and check nodes. The logic 30 also provides updated R messages to an R memory 14 and provides updated Q or P messages to a Q or P memory 16. The logic 30 receives values from the R memory 14 and the Q or P memory 16.

Conventionally, a layered decoder like layered LDPC decoder 10 may have L layers, L being an integer. A conventional decoder may go around and around through processing layers until L layers in a row report that the syndromes are all satisfied and until there have been no HD changes for L layers in a row. In a standard convergence unit 12, a layer count may only be incremented up towards L if all the HD change flags indicated that the HD had not changed and if the current syndrome is satisfied. If either an HD changed, or a syndrome was not satisfied, then the layer count may not be incremented up towards L, and/or may be reset all the way to zero. If the layer count ever reaches L, then the decoder 10 can stop and report convergence. However, this convergence technique is not optimal.

In one layered approach, different layers may be tasked with providing different partial decoding results. In one example, a syndrome is a function (e.g., binary addition) of all the variable node values in the bipartite graph that are connected to the same check node. The syndrome calculation involves verifying the parity checks of the current HD values (current decoded vector). A non-zero syndrome vector may signal some number of erroneous HD values. In one example, $b_i$ is a binary sequence corresponding to the bits connected to the check nodes at layer i. Syndrome $S_i = A^T b_i$ is the syndrome of layer i, where A is the parity check matrix of the layer i (this is a submatrix of the LDPC parity check matrix) and T is the transpose of a matrix. A layered decoder may sequentially decode given syndromes $S_i$ from the top layer to the bottom layer, and then return to the top layer to complete additional iterations, using previous decoding results to update the log likelihood ratios (LLRs) for each node or edge in the decoder graph until decoding is completed.

Conventional convergence logic for a layered decoder is sub-optimal because all layers of the layered LDPC decoder are considered and/or reconsidered before convergence can be determined. Conventionally, in a layered LDPC decoder, a syndrome update occurs in the current layer of the layered decoder. To finish updating an entire syndrome at least once for all layers requires running through at least one entire iteration of LDPC decoding. When a bit is flipped (e.g., corrected) during layered decoding, conventional decoders may cycle through yet another entire iteration of the decoder to insure that all syndromes are satisfied before reporting convergence. This may waste time and power.

Completing yet another entire iteration through a layered decoder may be wasteful when a correct codeword may be successfully and conclusively decoded in the current iteration. Also, in some instances, a correct codeword may be decoded after just a few layers in a layered decoder when, for example, the received vectors (e.g., LLRs) are correct or nearly correct.

FIG. 2 illustrates example convergence detection with conventional standard convergence logic in a conventional layered decoder 50. The current HD for a column J for a circulant 52, prior to processing at layer i, is the HD produced during the processing for a circulant 51 at layer i-3. During the processing of layer i, some HD for block column J may change due to updates obtained while processing circulant 52. It may take L−3 layers after layer i is processed to actually detect that the decoder 50 arrived at a valid codeword at layer i. This is sub-optimal.

LDPC codes are designed to have a structured parity check matrix to facilitate enhancing efficiency in storage (e.g., memory) and processing (e.g., encoder, decoder) units. An LDPC encoder takes in a word of length K and outputs a codeword of length N by inserting N−K redundancy bits. The encoder adds the bits as a function of an LDPC code.

SUMMARY

In one embodiment an apparatus includes a plurality of hardware layers, where a hardware layer is configured to compute a syndrome value from one or more bit values in the codeword. The apparatus includes a plurality of physical memories configured to store a plurality of syndrome values, where a physical memory is configured to store syndrome values computed by one or more hardware layers. The apparatus includes circuitry configured to simultaneously store a syndrome value computed by a hardware layer in physical memories associated with a bit in the codeword. The apparatus includes a decode logic configured to signal successful decoding of the codeword based, at least in part, on determining that a set of syndromes are satisfied based on values stored in the plurality of physical memories.

In another embodiment, a method includes initializing an LDPC code for use with a layered LDPC decoder configured with physical syndrome memories, and configuring the layered LDPC decoder to reduce the number of syndrome memories by restricting the position of non-zero circulants in a matrix associated with the LDPC code so that a column in the matrix has no more than a threshold number of non-zero circulants per physical syndrome memory in the layered LDPC decoder.

In another embodiment, a device includes an encoder configured to encode a codeword based, at least in part, on an LDPC code configured for use with a layered LDPC decoder configured with syndrome memories and configured to perform syndrome computation based on values in the syndrome memories.

BRIEF DESCRIPTION OF THE DRAWINGS

The accompanying drawings, which are incorporated in and constitute a part of the specification, illustrate various apparatuses and methods associated with instant syndrome computation. It will be appreciated that the illustrated element boundaries (e.g., boxes, groups of boxes, or other shapes) in the figures represent one example of the boundaries. In some examples, one element may be designed as multiple elements or multiple elements may be designed as one element. In some examples, an element shown as an internal component of another element may be implemented as an external component and vice versa. Furthermore, elements may not be drawn to scale.

DETAILED DESCRIPTION

Described herein are examples of apparatuses and methods associated with instant syndrome computation in a layered LDPC decoder. Examples of apparatuses and methods signal convergence earlier than conventional layered LDPC decoders. Examples of apparatuses and methods signal a correctly decoded codeword without requiring an additional iteration. Earlier termination is facilitated by adding physical memories to a layered LDPC decoder to store syndrome values. In one embodiment, one single bit memory per syndrome is added to a layered decoder to store syndrome values. Convergence circuitry can determine when all syndromes have been satisfied by analyzing the syndrome values. In another embodiment, less than one memory per syndrome is added to a layered decoder. Adding less than one memory per syndrome involves grouping stored syndromes into physically separate memories based on an organizational scheme. The organizational scheme may be based, for example, on modulo arithmetic. Intelligent LDPC code design facilitates having less than one physical memory per syndrome to be stored while avoiding access conflicts and without requiring multi-ported memory.

Figure 1:
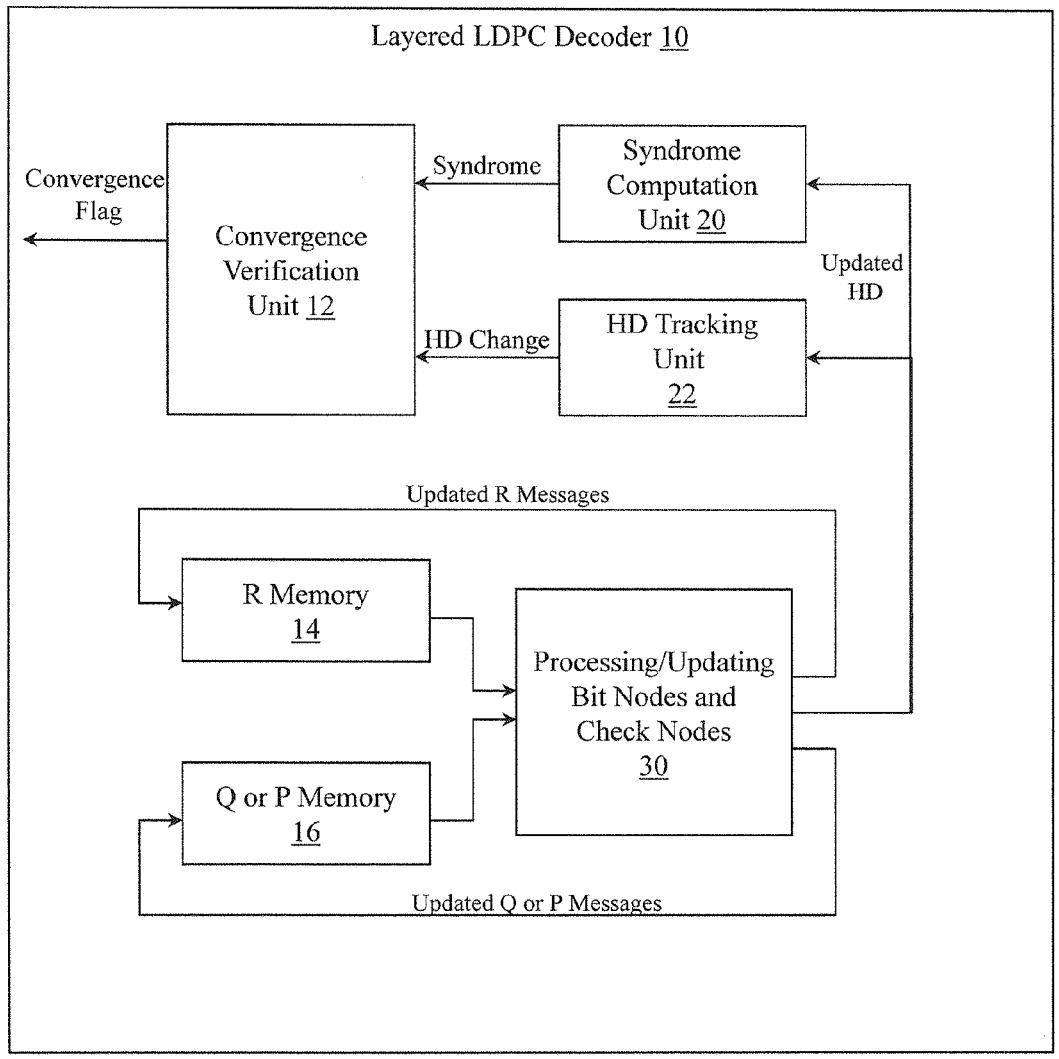
FIG. 1 illustrates one conventional layered LDPC decoder.
Figure 2:
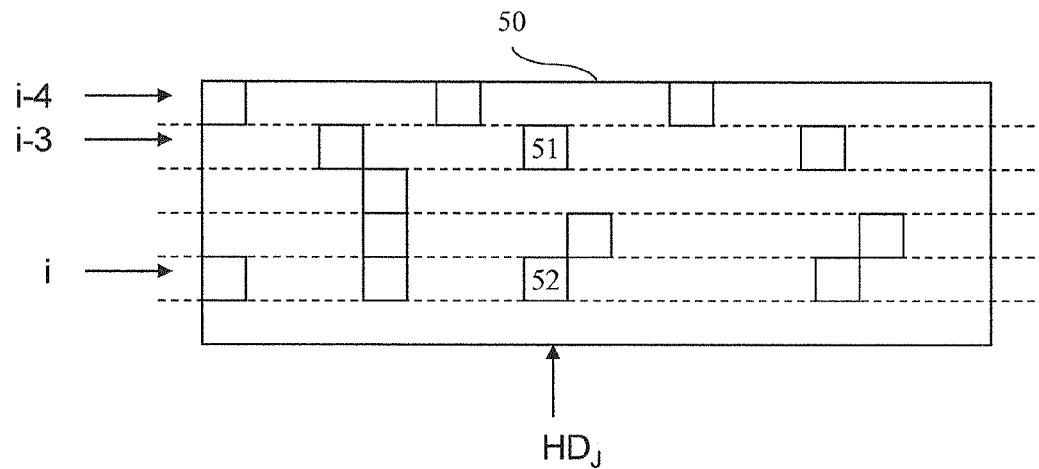
FIG. 2 illustrates an example of circulant processing in a conventional layered LDPC decoder.

Returning to FIG. 2, assume that the $HD_j$ that just changed is now correct. If all the other HDs for all the other columns were already correct, and the layered decoder 50 could verify, via instant syndrome computation, that they were all correct, then a determination that a valid codeword had just been decoded could be made. Layered decoders are able to make this instant syndrome computation due to the addition of the memories. However, in conventional layered decoders, the syndrome is not updated for layer i−3 in which the syndrome was incorrect because instant syndrome computation is not available. Thus the conventional current converged layer counter is only three. Thus, conventionally, it would take L−3 more layers to process before standard convergence logic declares convergence and stops. Layered decoders described and claimed herein would be able to stop sooner.

In a layered LDPC decoder, a final correction and/or final syndrome satisfaction may occur at different times in different layers. Some layers may have already participated in syndrome calculations that indicate that a portion of a codeword has been decoded correctly. The final correction may result in the entire code word having been correctly decoded. By adding syndrome memories to a decoding apparatus, syndrome calculations can be computed without progressing through all the rest of the layers of the decoder. This may be referred to as "instant" syndrome computation. When all the syndromes are satisfied, a decode verification signal can be produced without having to wait for another complete iteration through all the layers to see that all syndromes are satisfied, as is typically done. Conventionally, the LDPC code and thus the LDPC encoder may have not been designed to account for efficient LDPC decoding using instant syndrome computation. While LDPC codes (e.g., quasi-cyclic codes) have been implemented with a very structured parity check matrix according to conventional progressive edge growth (PEG) design constraints (e.g., girth, parity portion structure, row adjacency), or other design methodologies, these designs have typically not considered syndrome memory. The PEG construction is a well known algorithm for constructing graphs. In PEG, girth is defined as the size of the shortest cycle. Row adjacency refers to two rows in an adjacency matrix being next to each other. The parity portion structure constraint refers to the fact that for an LDPC code, the adjacency matrix and the parity-check matrix must be identical.

To facilitate instant syndrome calculations, physical memory can be designed so that all syndromes connected to the same bit can be updated as soon as the bit changes. To avoid a requirement for multi-port memory while providing single clock cycle responsiveness, syndrome memory can be organized as a function of LDPC codes so that memories associated with a syndrome can be accessed in the same clock cycle and so that a memory is accessed at most once per clock cycle.

To facilitate decoder design and to facilitate reducing the number of physical memories employed in a decoder, attention is paid to crafting the LDPC matrix. In one example, non-zero circulants need to be adequately and appropriately distributed across groups of rows, which leads to adequate and appropriate distribution across memory blocks associated with syndromes.

Figure 3:
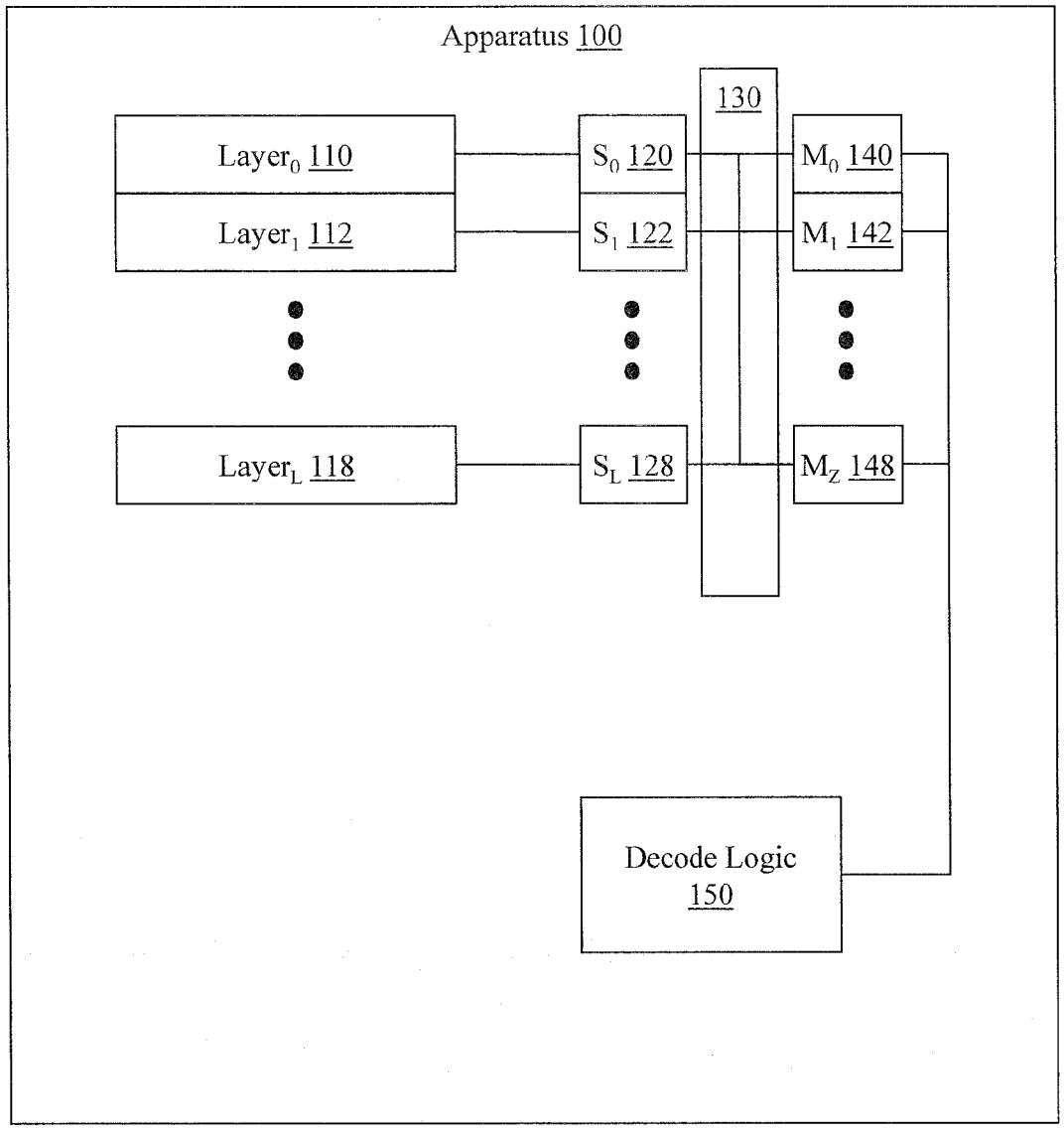
FIG. 3 illustrates one embodiment of an apparatus configured to perform instant syndrome computation.

FIG. 3 illustrates one embodiment of an apparatus 100 configured to perform instant syndrome computation. Apparatus 100 is a layered, low density parity check (LDPC) decoder configured to decode a codeword. Apparatus 100 includes a plurality of hardware layers (e.g., $layer_0$ 110 and $layer_1$ 112 through $layer_L$ 118) that compute a plurality of syndrome values (e.g., $S_0$ 120 and $S_1$ 122 through $S_L$ 128). Apparatus 100 includes circuitry 130 to connect the plurality of hardware layers to a plurality of syndrome memories (e.g., $M_0$ 140 and $M_1$ 142 through $M_Z$ 148) to facilitate providing the plurality of syndrome values. Apparatus 100 also includes a decode logic 150.

A hardware layer in apparatus 100 is configured to compute a syndrome value. While a one-to-one correspondence between hardware layers and syndrome values is illustrated, it is to be appreciated that other relationships between hardware layers and syndrome values are possible. An individual syndrome value is computed from one or more bit values in the codeword presented to apparatus 100 for decoding. A syndrome value may indicate that a portion of the codeword has been decoded successfully or may indicate that a portion of the codeword has not been decoded successfully. Conventionally, syndrome values may be updated through a layered decoder while the layered decoder counted how many layers had been resolved successfully. This sub-optimal counting procedure occurred because conventional decoders did not have syndrome memories. Apparatus 100 includes the plurality of memories to store syndrome values which in turn facilitates instant syndrome computation.

A physical memory (e.g., $M_0$ 140) is configured to store a syndrome value(s) computed by one or more hardware layers (e.g., $Layer_0$ 110, $Layer_L$ 118). In one embodiment, there is a physical memory for each syndrome value computed. In this embodiment, the physical memory may be a single bit memory. In another embodiment, there are fewer physical memories than there are syndrome values. In this embodiment, the physical memory may store more than a single bit. Storing more than one syndrome value in a memory could lead to access conflicts. Therefore, the LDPC code used by apparatus 100 may be carefully crafted as described in association with method 300 (FIG. 5) to avoid access conflicts.

Circuitry 130 is configured to simultaneously store a syndrome value computed by a hardware layer in the one or more physical memories associated with a bit in the codeword. In one embodiment, a bit may be associated with two or more syndromes. This means that the values of two or more syndromes may all depend on the value of the same bit, or that a single bit can be involved in more than one syndrome calculation. Conventionally, this multiple dependency may have lead to the requirement for completing an iteration of a loop around the layered decoder to determine whether decoding was successful. With syndrome memories available to decode logic 150, this iteration completion requirement may be removed.

Rather than maintaining a count of layers where syndromes have been satisfied, apparatus 100 includes a decode logic 150 that is configured to signal successful decoding of the codeword. Determining whether successful decoding has occurred is based, at least in part, on determining that a set of syndromes are satisfied based on values stored in the plurality of physical memories. For example, determining that all syndrome values have been computed and that all syndrome values are currently zero can indicate successful decoding. Since the current syndrome values are substantially instantaneously available in the plurality of memories, decoding success can also be substantially instantaneously determined. In one example, "substantially instantaneously" means "in one clock cycle". For example, one clock cycle may be required to transfer syndrome values from the hardware layers to the memories and then another clock cycle may be required to compute the logical "or" of all the memories. Thus, in one example, a determination concerning decoding success may be made in two clock cycles.

One bit may be involved in two or more syndrome calculations. Recall that a physical memory is associated with a syndrome to facilitate instant syndrome calculation. When one bit is involved in two syndrome calculations, then two syndrome memories may need to be accessed. In one embodiment, the two physical memories associated with the two syndromes that are associated with a single bit in the codeword are configured to be accessed in the same clock cycle. Conventionally, this may have required the memories to be dual-ported because a memory may have been receiving inputs from multiple syndrome computations. However, when the LDPC code is designed according to non-zero circulant constraints described herein (see, for example, method 300, FIG. 5), then the two or more physical memories do not need to be multi-ported to achieve the simultaneous access due to the grouping strategy. One grouping strategy involves establishing a correspondence between physical memories and an LDPC code. In this strategy, non-zero circulants in a sparse matrix associated with the LDPC code are distributed across groups of rows in the matrix so that, per one column in the matrix, no more than a threshold number of non-zero circulants appear in each group of rows in the matrix. The multi-port requirement is also relieved by configuring the apparatus 100 as a function of the non-zero circulant constraints so that a physical memory associated with two or more syndromes is configured to be accessed at most once in a clock signal. Multiple accesses per clock cycle could require multi-porting, whereas a single access per clock cycle can be achieved with single-porting.

In one example, the decode logic 150 is configured to signal successful decoding of the codeword without requiring completing an extra iteration through the plurality of hardware layers in the LDPC decoder apparatus 100. In this example, convergence in decoding the codeword in the layered LDPC decoder apparatus 100 is based on instant syndrome computation without counting layers where syndromes have been satisfied in the layered LDPC decoder apparatus 100.

By grouping syndromes into memories, it is possible to have fewer physical memories than syndromes. Thus, in one embodiment, the plurality of physical memories has fewer members than the plurality of syndrome values. In this embodiment, L from $S_L$ 128 is less than Z from $M_Z$ 148.

The syndrome values may be grouped into the memories in different ways. In one example, the plurality of syndrome values are grouped into two or more groups. In this example, syndrome values for a single group having two or more members are stored in a single physical memory. Group membership may be determined, for example, by mod(r,M) where mod is the modulo function, where r is a row number associated with a syndrome, the row being one of a number of rows in a sparse matrix associated with the LDPC code, and where M is an integer describing the number of groups in the two or more groups. This means that rows having the same remainder after division by M would be grouped into the same group. Different groupings are possible. For example, contiguous rows may be grouped together, rows may be interleaved into groups, random sets of rows may be grouped together, and so on.

One grouping strategy involves establishing a correspondence between physical memories and an LDPC code. In this strategy, non-zero circulants in a sparse matrix associated with the LDPC code are distributed across groups of rows in the matrix so that, per one column in the matrix, no more than a threshold number of non-zero circulants appear in each group of rows in the matrix. The threshold number of non-zero circulants may be, for example, one. While a threshold of one is described, it is to be appreciated that other thresholds may be employed.

Figure 4:
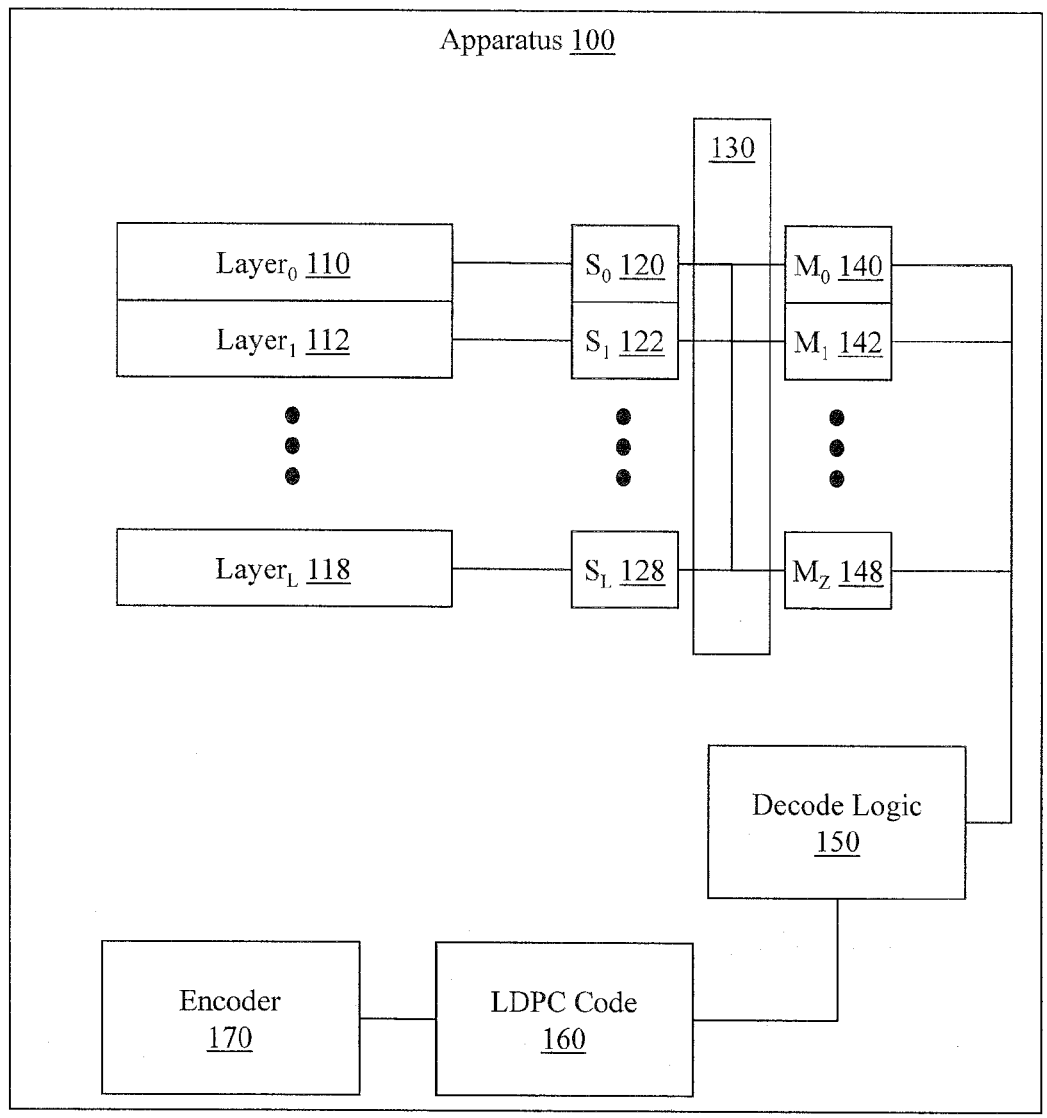
FIG. 4 illustrates another embodiment of an apparatus configured to perform instant syndrome computation.

FIG. 4 illustrates another embodiment of apparatus 100. In addition to all the elements found in the embodiment illustrated in FIG. 3, this embodiment also includes an encoder 170 that is configured to encode a codeword based, at least in part, on an LDPC code 160 configured for use with layered LDPC decoder apparatus 100. Recall that apparatus 100 is configured with syndrome memories and is configured to perform instant syndrome computation based on values in the syndrome memories.

In one embodiment, the LDPC code 160 is configured to decode the codeword to minimize the number of syndrome memories required to support instant syndrome computation in the layered LDPC decoder apparatus 100. The minimization is achieved by constraining the LDPC code 160 to restrict the position of non-zero circulants in a matrix associated with the LDPC code 160. The non-zero circulants are restricted so that a column in the matrix has no more than a threshold number of ones per physical syndrome memory in the layered LDPC decoder apparatus 100.

In one example, the LDPC code 160 is configured to facilitate having less syndrome memories than there are syndromes associated with decoding the LDPC code. For example, layered LDPC decoder apparatus 100 may compute 128 syndromes and store the values in 64 physical memories. To achieve this memory savings, the LDPC code 160 may be designed using additional constraints on top of conventional Progressive Edge Growth (PEG) techniques. While the LDPC code 160 is illustrated inside apparatus 100, in one embodiment, information describing the code may reside outside the apparatus 100.

Figure 5:
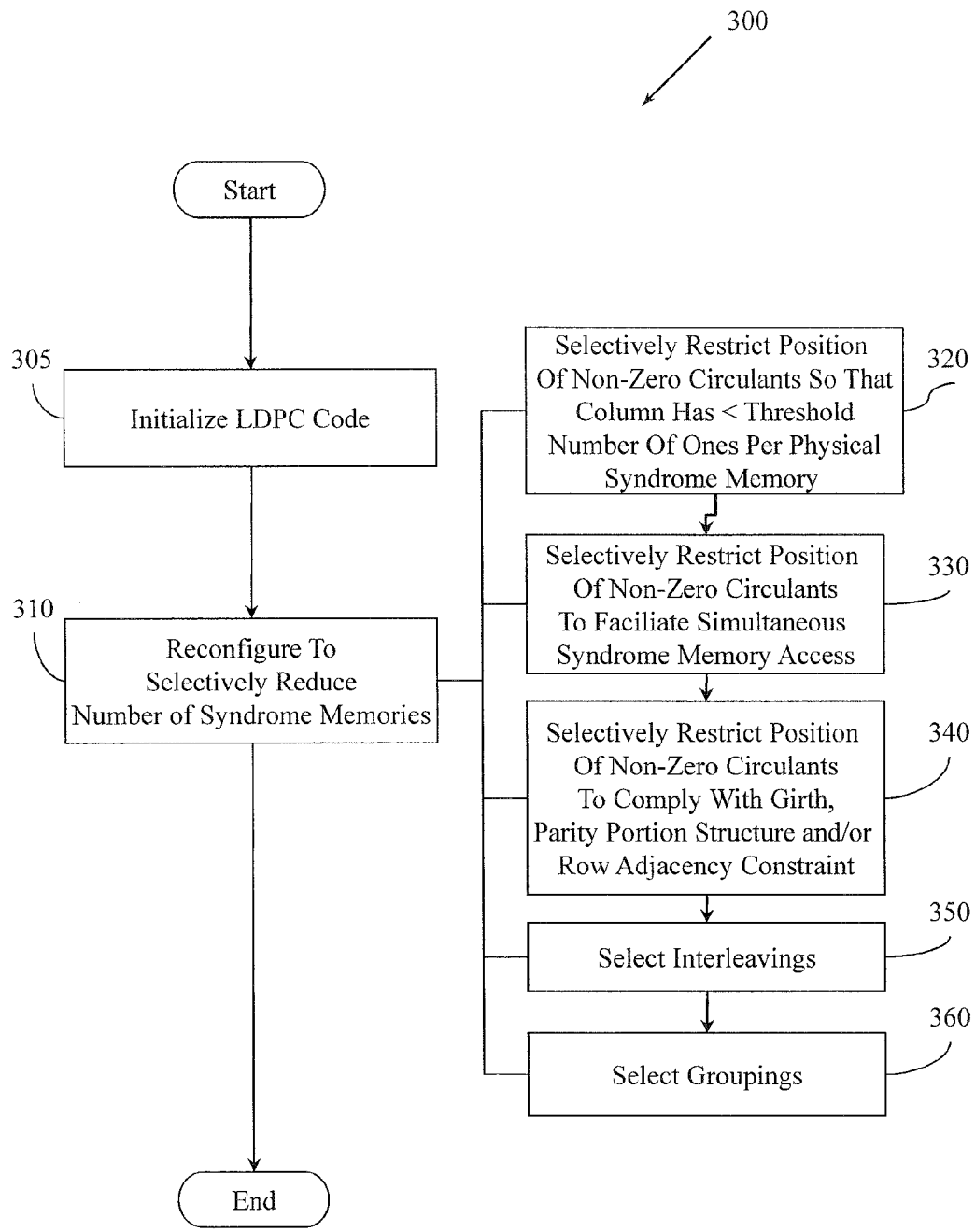
FIG. 5 illustrates one embodiment of a method for providing an LDPC code for use with an apparatus configured to perform instant syndrome computation.

FIG. 5 illustrates one embodiment of a method 300 for intelligently designing LDPC codes for use with an apparatus (e.g., apparatus 100, FIG. 3) associated with instant syndrome computation. In one example, a computer-readable medium may store computer-executable instructions that when executed by the computer control the computer to perform method 300. Method 300 may also be performed in hardware. At 305, method 300 involves initializing an LDPC code (e.g., LDPC code 160, FIG. 4) for use with a layered LDPC decoder configured with physical syndrome memories and configured to perform instant syndrome computation (e.g., apparatus 100, FIG. 3).

At 310, method 300 includes reconfiguring a layered LDPC decoder to selectively reduce the number of syndrome memories required to support instant syndrome computation. Selectively reducing the number of memories may involve, for example, determining that a number of memories less than the number of syndromes to be computed are required and then manipulating the LDPC code or manipulating groupings and interleavings of syndromes. Reducing the number of syndrome memories required may be facilitated, at 320, by selectively restricting the position of non-zero circulants in a matrix associated with the LDPC code. The restriction at 320 may require that a column in the matrix has no more than a threshold number of ones per physical syndrome memory in the layered LDPC decoder, where a "one" represents a non-zero circulant. In one embodiment, the threshold number of non-zero circulants is one. In other embodiments, other threshold numbers may be employed.

At 330, reducing the number of syndrome memories may also be facilitated by restricting the position of non-zero circulants so that syndrome memories corresponding to a column in the matrix can be accessed simultaneously (e.g., in one clock cycle) if necessary. Being able to access multiple syndrome memories simultaneously facilitates reducing the amount of time required to signal a successful decode. While it is useful to be able to access (e.g., write) two or more memories at one time, it is also useful to prevent a physical memory from being accessed twice in one syndrome update cycle. Therefore, at 340, method 300 includes restricting the position of non-zero circulants so that a physical syndrome memory is accessed at most once per clock cycle.

In one embodiment, the actions taken at 310, 320, 330, and 340 are performed in conjunction with conventional Progressive Edge Growth (PEG) constraints. Therefore, in one embodiment, at 340, method 300 includes restricting the position of non-zero circulants to comply with PEG constraints including one or more of, a girth constraint, a parity portion structure constraint, and/or a row adjacency constraint. It will be appreciated that other PEG constraints may be considered.

Method 300 may be confronted with at least two different situations. In one situation, an LDPC code may already be established. In this case, it may not be possible to restrict the non-zero circulant positions because the LPDC code already has non-zero circulant positions that would not be selected if the LDPC code was being crafted by method 300. In this case, reducing the number of syndrome memories may depend on the organization of how syndrome values are stored in the physical memories in the layered LDPC decoder. Recall that the syndromes values are computed in different layers and that layers may be grouped. In different embodiments, different interleavings of rows may be selected at 350 and different groupings of rows may be selected at 360. The interleavings and groupings may be selected based on either the pre-established LDPC code presented to method 300 or on the LDPC code being crafted by method 300.

Therefore, in one embodiment, upon determining that the LDPC code is a pre-defined, pre-established code, method 300 may include selecting interleavings of rows that comport with the LDPC code as constrained by parity structure, and non-zero circulant dispersal associated with the pre-defined, pre-established code. In this embodiment, method 300 may include selecting rows to group into individual physical memories to facilitate (i) minimizing the number of separate physical memories required by the LDPC decoder, (ii) giving substantially equal numbers of rows to groups, (iii) accessing codeword syndromes corresponding to a given column in the matrix in the same clock cycle if necessary, and (iv) accessing physical memories at most once per clock cycle.

In another embodiment, upon determining that the LDPC code is not a pre-defined, pre-established code, method 300 may include selecting interleavings of rows as constrained by one or more of, parity structure, row adjacency, and non-zero circulant dispersal for the LDPC code being crafted. This embodiment may also include selecting rows to group into individual physical memories to facilitate (i) minimizing the number of separate physical memories required by the LDPC decoder, (ii) giving substantially equal numbers of rows to groups, (iii) accessing codeword syndromes corresponding to a given column in the matrix in the same clock cycle if necessary, and (iv) accessing physical memories at most once per clock cycle.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, instructions stored on a non-transitory medium or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. A layered, low density parity check (LDPC) decoder apparatus configured to decode a codeword, comprising:
a plurality of hardware layers, where each hardware layer is configured to compute a syndrome value from one or more bit values in the codeword;
a plurality of physical memories configured to store a plurality of syndrome values, where each respective physical memory is configured to:
   i) store respective one or more syndrome values for respective one or more syndromes associated with the physical memory, such that:
      a first physical memory stores a first group of syndrome values computed for the codeword, and
      a second physical memory stores a second group of syndrome values computed for the codeword, and
   ii) persist each syndrome value in memory until the syndrome value changes due to a change in a codeword bit value;
circuitry configured to store respective syndrome values for respective syndromes in respective physical memories associated with the respective syndromes; and
a decode logic configured to signal successful decoding of the codeword based, at least in part, on determining that a set of syndromes are satisfied based on syndrome values stored in the plurality of physical memories.

2. The apparatus of claim 1, wherein two or more physical memories associated with two or more syndromes that are associated with a single bit in the codeword are configured to be accessed in a same clock cycle.

3. The apparatus of claim 2, wherein a physical memory associated with two or more syndromes is configured to be accessed at most once in a clock signal, and where the physical memory is not multi-ported.

4. The apparatus of claim 1, wherein the decode logic is configured to signal successful decoding of the codeword before completing a current iteration through the plurality of hardware layers in the LDPC decoder apparatus.

5. The apparatus of claim 1, wherein convergence in a decoding of the codeword is based on instant syndrome computation independent of counting hardware layers where syndromes have been satisfied.

6. The apparatus of claim 1, wherein the plurality of physical memories has fewer members than the plurality of syndrome values.

7. The apparatus of claim 6, wherein the plurality of syndrome values are grouped into two or more groups, where the syndrome values for a group are stored in a single physical memory, and where group membership is determined by mod (r,M), where mod is the modulo function, where r is a row number associated with a syndrome, the row being one of a number of rows in a sparse matrix associated with the LDPC code, and where M is an integer describing a number of groups in the two or more groups.

8. The apparatus of claim 6, wherein a physical memory is configured to store two or more syndrome values based, at least in part, on establishing a correspondence between the physical memory and an LDPC code, where non-zero circulants in a sparse matrix associated with the LDPC code are distributed across groups of rows in the matrix so that, for a given column of the matrix, no more than a threshold number of non-zero circulants appear in each group of rows in the matrix.

9. The apparatus of claim 1, wherein a physical memory is configured to store two or more syndrome values, and wherein the physical memory stores values associated with one of (i) two or more contiguous rows in the layered LDPC decoder, and (ii) two or more interleaved rows in the layered LDPC decoder.

10. A method comprising:
initializing an LDPC code for use with a layered LDPC decoder configured with physical syndrome memories that store syndrome values until the syndrome values change due to a change in a codeword bit value, and
configuring the layered LDPC decoder to reduce the number of syndrome memories by restricting the position of non-zero circulants in a matrix associated with the LDPC code so that a column in the matrix has no more than a threshold number of non-zero circulants per physical syndrome memory in the layered LDPC decoder.

11. The method of claim 10, further comprising:
restricting a position of non-zero circulants in the matrix so that syndrome memories corresponding to a column in the matrix can be accessed simultaneously if necessary, and
restricting the position of non-zero circulants in the matrix so that a physical syndrome memory is accessed at most once per clock cycle.

12. The method of claim 10, further comprising:
restricting the position of non-zero circulants in the matrix to comply with one or more of, a girth constraint, a parity portion structure constraint, and a row adjacency constraint.

13. The method of claim 10, further comprising:
upon determining that the LDPC code is a pre-defined, pre-established code:
selecting interleavings of rows that agree with the LDPC code as constrained by parity structure, and non-zero circulant dispersal; and
selecting rows to group into individual physical memories to facilitate (i) minimizing a number of separate physical memories required by the LDPC decoder, (ii) giving substantially equal numbers of rows to groups, (iii) accessing codeword syndromes corresponding to a given column in the matrix in a same clock cycle if necessary, and (iv) accessing physical memories at most once per clock cycle.

14. The method of claim 10, further comprising:
upon determining that the LDPC code is not a pre-defined, pre-established code:
selecting interleavings of rows as constrained by one or more of, parity structure, row adjacency, and non-zero circulant dispersal; and
selecting rows to group into individual physical memories to facilitate (i) minimizing a number of separate physical memories required by the LDPC decoder, (ii) giving substantially equal numbers of rows to groups, (iii) accessing codeword syndromes corresponding to a given column in the matrix in a same clock cycle if necessary, and (iv) accessing physical memories at most once per clock cycle.

15. The method of claim 14, further comprising:
designing the LDPC code matrix as a function of restricted row placement of circulants based on defined groups of rows that satisfy Progressive Edge Growth (PEG) constraints including (i) a girth constraint, (ii) a parity portion structure constraint, and/or (iii) a row adjacency constraint.

16. A device, comprising:
a layered, low density parity check (LDPC) decoder apparatus configured to decode a codeword, comprising:
a plurality of hardware layers, where each hardware layer is configured to compute a syndrome value, where a syndrome value is computed as a function of one or more bit values in the codeword;
a plurality of physical memories configured to store a plurality of syndrome values, where each physical memory is configured to store syndrome values computed by one or more of the hardware layers and persist the syndrome values until the syndrome values change due to a change in a codeword bit value, such that a first physical memory stores syndrome values computed for the codeword and a second physical memory stores syndrome values computed for the codeword.

17. The device of claim 16, further comprising an encoder configured to encode the codeword to facilitate reducing a number of syndrome memories required in the LDPC decoder, and where the LDPC code is constrained to restrict the position of non-zero circulants in a matrix associated with the LDPC code so that a column in the matrix has no more than a threshold number of non-zero circulants per physical syndrome memory in the layered LDPC decoder.

18. The device of claim 17, where the LDPC code is configured to facilitate having less syndrome memories than there are syndromes associated with decoding the LDPC code.

19. The device of claim 16, further comprising:
circuitry configured to simultaneously store a syndrome value computed by a hardware layer in physical memories associated with a bit in the codeword; and
a decode logic configured to signal successful decoding of the codeword based, at least in part, on determining that a set of syndromes are satisfied based on values stored in the plurality of physical memories.

20. The device of claim 19,
where two or more physical memories associated with two or more syndromes that are associated with a single bit in the codeword are configured to be accessed in the same clock cycle,
where a physical memory associated with two or more syndromes is configured to be accessed at most once in a clock signal, and
where the decode logic is configured to signal successful decoding of the codeword without requiring (i) completing a current iteration through the plurality of hardware layers in the LDPC decoder apparatus, and (ii) counting layers where syndromes have been satisfied in the layered LDPC decoder apparatus.

* * * * *